United States Patent [19]

Tomioka

[11] Patent Number: 4,931,406

[45] Date of Patent: Jun. 5, 1990

[54] METHOD FOR MANUFACTURING SEMICONDUCTOR DEVICES HAVING TWIN WELLS

[75] Inventor: Kazuhiko Tomioka, Yokohama, Japan

[73] Assignee: Kabushiki Kaisha Toshiba, Kawasaki, Japan

[21] Appl. No.: 282,138

[22] Filed: Dec. 9, 1988

[30] Foreign Application Priority Data

Dec. 18, 1987 [JP] Japan ................................. 62-318649

[51] Int. Cl.$^5$ ........................................... H01L 21/265
[52] U.S. Cl. ........................................ 437/27; 437/28; 437/29; 437/34; 437/40; 437/41; 437/45; 437/57; 437/228
[58] Field of Search ..................... 437/27–29, 437/30, 34, 40, 41, 45, 56, 57, 59, 228; 357/40

[56] References Cited

U.S. PATENT DOCUMENTS

| | | | |
|---|---|---|---|
| 3,897,274 | 7/1975 | Stehlin et al. | 437/27 |
| 4,306,916 | 12/1981 | Wollesen | 437/27 |
| 4,346,512 | 8/1982 | Liang et al. | 437/59 |
| 4,574,467 | 3/1986 | Halfacre | 437/28 |
| 4,637,125 | 1/1987 | Iwasaki et al. | 437/57 |
| 4,710,477 | 12/1987 | Chen | 437/57 |
| 4,717,683 | 1/1988 | Parrillo et al. | 437/27 |
| 4,818,716 | 4/1989 | Okuyama et al. | 437/27 |

Primary Examiner—Brian E. Hearn
Assistant Examiner—T. Thomas
Attorney, Agent, or Firm—Finnegan, Henderson, Farabow, Garrett and Dunner

[57] ABSTRACT

A method for manufacturing twin well type semi-conductor devices includes the steps of forming a first layer on a P-type silicon substrate, selectively removing part of the first layer to expose a predetermined portion of the surface of the substrate, ion-implanting phosphorus to introduce the phosphorus into the surface area of the substrate under the first layer and into a portion of the substrate deeper than the substrate surface area below the predetermined portion of the substrate surface, ion-implanting boron to introduce the boron into the surface area of the first layer and the surface area under the predetermined portion of the substrate, removing the first layer, and effecting heat treatment to diffuse the introduced phosphorus and boron.

13 Claims, 3 Drawing Sheets

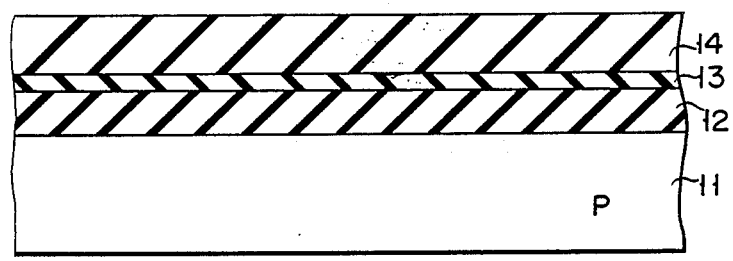
F I G. 1A
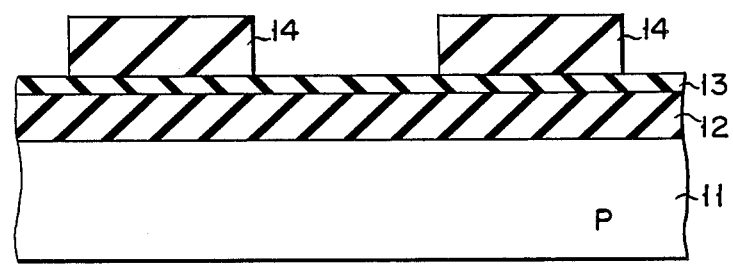
F I G. 1B
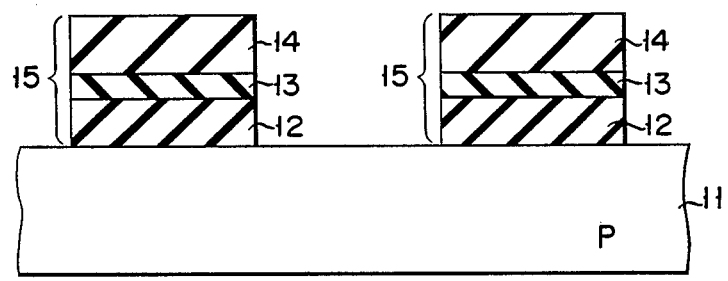
F I G. 1C
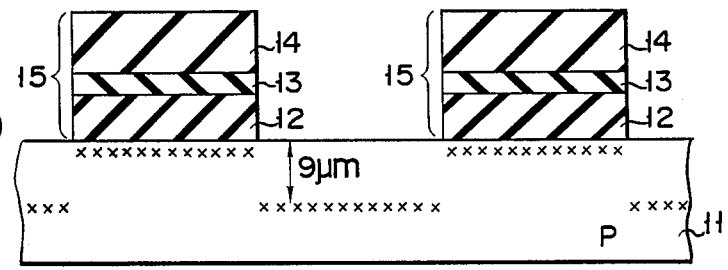
F I G. 1D

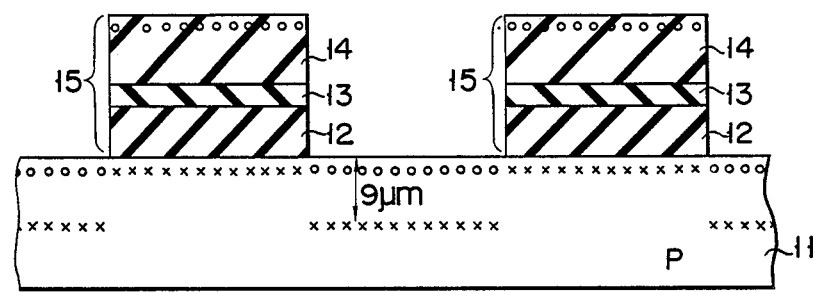
F I G. 1E
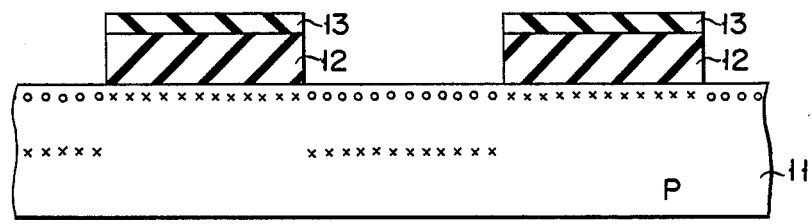
F I G. 1F
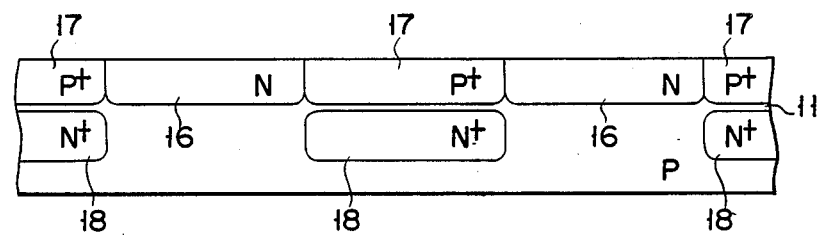
F I G. 1G

METHOD FOR MANUFACTURING SEMICONDUCTOR DEVICES HAVING TWIN WELLS

BACKGROUND OF THE INVENTION

1. Field of the Invention

This invention relates to a method for manufacturing semiconductor devices, and more particularly to a method for manufacturing semiconductor devices having twin wells, such as CMOS semiconductor devices and Bi-CMOS semiconductor devices.

2. Description of the Related Art

CMOS semiconductor devices and Bi-CMOS semiconductor devices have P-type and N-type wells formed in a substrate. Such semiconductor devices having two wells of different conductivity types are well known in the art as twin well type semiconductor devices.

In the twin well type semiconductor device, an embedded layer of a conductivity type opposite to that of the substrate is formed below a well of the same conductivity type as that of the substrate in order to prevent occurrence of latch-up phenomenon. For example, in a semiconductor device having a P-type substrate, an N-type embedded layer is formed below a P-type well so as to prevent occurrence of latch-up phenomenon.

In a case where the twin well type semiconductor device is formed, an embedded layer is first formed in the surface area of a substrate by a normal photolithographic technique and ion implantation process. Then, an epitaxial layer is formed on the entire surface of the semiconductor structure, and P-type and N-type wells are sequentially formed in the epitaxial layer. In this case, the P-type well is formed by use of the photolithographic technique and P-type impurity ion implantation process. Likewise, N-type well is formed by use of the photolithographic technique and N-type impurity ion implantation process.

Thus, it is necessary to repeatedly effect the photolithographic process and P-type impurity ion implantation process three times in order to form a twin well type semiconductor device. Such a complicated manufacturing method causes low manufacturing yield and high cost of semiconductor devices.

SUMMARY OF THE INVENTION

An object of this invention is to provide a method for manufacturing semiconductor devices having twin wells and an embedded layer in a simple process without repeatedly effecting the photolithographic process and ion implantation process.

According to this invention, there is provided a method for manufacturing semiconductor devices comprising the steps of forming a first layer on a semiconductor substrate of a first conductivity type; selectively removing part of the first layer to expose a predetermined portion of the substrate surface; ion-implanting impurities of a second conductivity type to introduce the impurity of the second conductivity type into the surface area of the substrate under the first layer and into a portion of the substrate deeper than the substrate surface area below the predetermined portion of the substrate surface; ion-implanting impurities of the first conductivity type to introduce the impurity of the first conductivity type into the surface areas of the first layer and the predetermined portion of the substrate; removing the first layer; and effecting heat treatment to diffuse the first and second impurities.

In the above manufacturing method, since the first and second impurities are ion-implanted with the first layer used as a common mask, only one patterning process is required to form the mask. Further, since the first impurities are introduced into different regions in different depths, the first conductivity type well and the first conductivity type embedded layer are formed by one ion-implantation process. In this way, a semiconductor device having twin wells can be formed in a simple process without repeatedly effecting the photolithographic process and ion implantation process.

BRIEF DESCRIPTION OF THE DRAWINGS

FIGS. 1A to 1H are cross sectional views showing a method for manufacturing a semiconductor having twin wells according to one embodiment of this invention.

DETAILED DESCRIPTION OF THE PREFERRED EMBODIMENTS

Figure 1H:
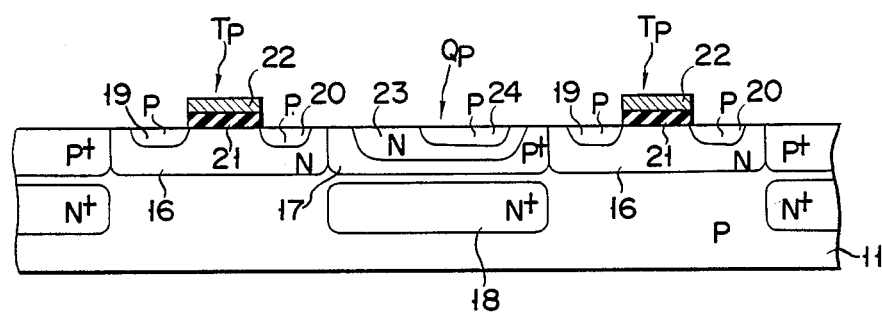

There will now be described a method for manufacturing semiconductor devices having twin wells according to one embodiment of this invention with reference to FIGS. 1A to 1H.

As shown in FIG. 1A, silicon oxide film (SiO$_2$) 12 with 3 to 4 $\mu$m thickness is first formed on P-type silicon substrate 11. Then, silicon nitride film (Si$_3$N$_4$) 13 with the thickness of 3000 to 5000 Å is formed on silicon oxide film 12, and resist layer 14 containing organic compound as the main component is formed to a thickness of 3 to 8 $\mu$m on silicon nitride film 13.

Next, as shown in FIG. 1B, resist film 14 is patterned by a photolithographic technique, and then an anisotropic etching process such as RIE process is effected with patterned resist film 14 used as a mask. As shown in FIG. 1C, at the end of the etching process, silicon nitride film 13 and silicon oxide film 12 are selectively removed to expose a predetermined portion of the surface of substrate 11.

Then, an N-type impurity such as phosphorus (P) is ion-implanted with block layer 15, which is formed of the remaining resist layer 14, silicon nitride film 13 and silicon oxide film 12, used as a mask in order to form N-type wells and N-type embedded layers. The acceleration voltage in the ion-implantation process is so set that phosphorus can be introduced into the surface area of substrate 11 through block layer 15 as shown by marks x in FIG. 1D and into a portion deeper than the substrate surface area in the exposed predetermined portion. In a case where three-layered block layer 15 is used as a mask as described before, it is preferable to ion-implant phosphorus by use of an acceleration voltage of 1.5 to 2.5 MeV. In this condition, it is possible to introduce phosphorus into an area near the surface area of substrate 11 under block layer 15 and into a portion deeper than the substrate surface area by approx. 9 $\mu$m under the predetermined portion. The dose amount of phosphorus at the time of the ion-implantation is preferably set to approx. $3 \times 10^{12}$.

Next, a P-type impurity such as boron (B) is ion-implanted with block layer 15 used as a mask in order to form P-type wells. The acceleration voltage in the ion-implantation process is so set that introduction of boron into substrate 11, as shown by marks o in FIG. 1E, is prevented by block layer 15, and at the same time boron can be introduced into the substrate surface area in the exposed predetermined portion. It is preferable to ion-implant boron at an acceleration voltage of 80 to 120 KeV. In this condition, boron is not introduced into substrate 11 under block layer 15 and is introduced into substrate 11 in the predetermined portion to substantially the same depth as phosphorus doped into substrate 11 under block layer 15. The dose amount of boron at the time of the ion-implantation is preferably set to approx. $2 \times 10^{12}$.

Then, as shown in FIG. 1F, a wet etching process is effected using a mixture of sulfuric acid solution and hydrogen peroxide solution to remove resist layer 14.

After this, as shown in FIG. 1G, silicon nitride film 13 is removed by a chemical vapor etching process, and then a wet etching process is effected using ammonium fluoride ($NH_4F$) solution to remove silicon oxide film 12. Further, a heat treatment is effected to diffuse phosphorus and boron which have been introduced in substrate 11. The heat treatment is effected for approx. three hours at a temperature of 1000° to 1200° C. At the end of the heat treatment, the phosphorus and boron are diffused to form N-type wells 16, P-type wells 17 and N-type embedded layers 18 as shown in FIG. 1G. In this case, the impurity concentration of N-type wells 16 and P-type wells 17 is approx. $1 \times 10^{16}$ to $1 \times 10^{17}/cm^3$, and the impurity concentration of N-type embedded layers 18 is approx. $1 \times 10^{18}$ to $1 \times 10^{19}/cm^3$.

In this way, the impurity concentration of N-type embedded layer 18 is set to be higher than that of N-type well 16. This is because phosphorus has been ion-implanted into that part of substrate 11 which corresponds to the N-type well through block layer 15 and phosphorus has been directly ion-implanted into that portion of substrate 11 which corresponds to N-type embedded layer 18. In other words, the amount of phosphorus introduced into substrate 11 under block layer 15 is reduced by the presence of block layer 15.

In general, the latch-up phenomenon can be more effectively prevented as the impurity concentration of N-type embedded layer 18 is set higher. Therefore, it is a significant advantage that N-type embedded layer 18, having a higher impurity concentration than N-type well 16, can be formed by effecting a single ion-implantation process.

Next, as shown in FIG. 1H, P-channel MOS transistors $T_P$ and PNP transistors Qp are respectively formed in N-type wells 16 and P-type wells 17 by using the normal MOS process and bipolar process which are well known in the art.

In P-channel MOS transistor Tp, P-type layers 19 and 20 act as the source and drain of transistor $T_p$, and metal film 22 formed on insulation film 21 which is formed on N-type well 16 acts as a gate electrode thereof. In PNP transistor Qp, P-type well 17 acts as a collector of PNP transistor Qp, and N-type layer 23 and P-type layer 24 respectively act as the base and emitter thereof.

In this embodiment, boron is ion-implanted as the P-type impurity after phosphorus of N-type impurity has been ion-implanted. However, it is also possible to ion-implant boron first and then ion-implant phosphorus. Further, it is possible to use boron fluoride ($BF_2$) instead of boron and arsenide instead of phosphorus.

It is also possible to remove resist layer 14 prior to the ion-implantation process, and effect the ion-implantation process with the two-layered block layer of silicon oxide film 12 and silicon nitride film 13 used as a mask. However, in this case, it is necessary to make silicon nitride film 13 thicker so that the two-layered block layer may have the same ion stopper function as block layer 15 having resist layer 14.

Further, it is possible to form an N-channel MOS transistor instead of PNP transistor Qp in P-type well 17. In this case, the semiconductor device shown in FIG. 1H is modified to a CMOS semiconductor device.

Figure 2:
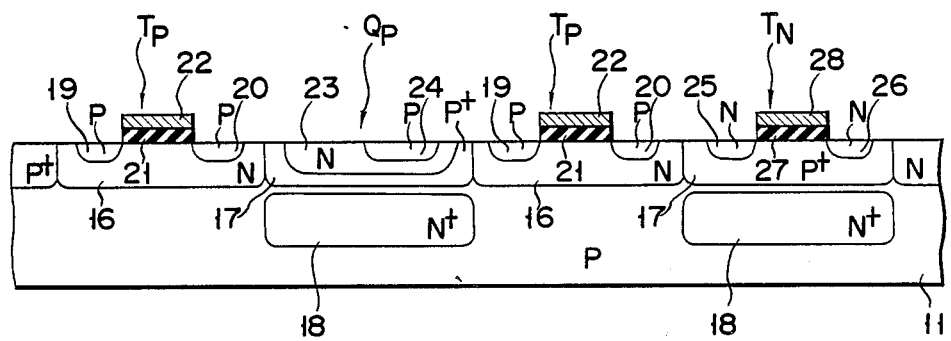
FIG. 2 is a cross sectional view of a Bi-CMOS semiconductor device formed by the manufacturing method shown in FIG. 1A to 1H.

FIG. 2 is a cross sectional view of a semiconductor device in which a plurality of P-type wells 17 are formed in substrate 11, and PNP transistors Qp and N-channel MOS transistors TN are selectively formed in P-type wells 17. In N-channel MOS transistor TN of FIG. 2, N-type layers 25 and 26 act as the source and drain and metal film 28 formed on insulation film 27 which is in turn formed on P-type well 17 acts as a gate electrode. The semiconductor device of FIG. 2 is a Bi-CMOS semiconductor device.

As described above, according to the manufacturing method of this invention, block layer 15 is used as a common mask for ion-implantation processes of N- and P-type impurities. Therefore, the patterning process necessary for forming the mask is effected only once. Further, N-type well 16 and high impurity N-type embedded layer 18 can be formed by a single ion-implantation process without forming an epitaxial layer. Thus, a twin well type semiconductor device can be formed by a simple manufacturing process, keeping the manufacturing cost low and enhancing the manufacturing yield.

What is claimed is:

1. A method for manufacturing twin well type semiconductor devices having a P-type well and an N-type well comprising the steps of:

forming an insulating layer of a laminated structure having two or more layers on a semiconductor substrate of a first conductivity type;

selectively removing part of said insulating layer to expose a predetermined portion of a surface of said semiconductor substrate;

ion-implanting an impurity of a second conductivity type using said insulating layer as a mask to introduce the impurity of the second conductivity type into the surface of said semiconductor substrate under said insulating layer, thereby forming a first impurity region of the second conductivity type, and into that portion of said semiconductor substrate that is deeper than the surface of said semiconductor substrate and is below said predetermined portion of the substrate surface, thereby forming a second impurity region of the second conductivity type having an impurity concentration higher than that of said first impurity region;

ion-implanting an impurity of the first conductivity type to introduce the impurity of the first conductivity type into said predetermined portion, thereby forming a third impurity region of the first conductivity type;

removing said insulating layer; and diffusing the introduced first and second impurities by heat treatment to form a first well region of the second conductivity type in the substrate surface under a portion where said insulating layer had been formed, a second well region of the first conductivity type in the predetermined portion of the substrate surface, and an embedded region of the second conductivity type in a lower portion of the predetermined portion, said embedded region having an impurity concentration higher than that of said first well region.

2. A method for manufacturing semiconductor devices according to claim 1, wherein said step of ion-implanting the second conductivity type impurity is effected prior to said step of ion-implanting the first conductivity type impurity.

3. A method for manufacturing semiconductor devices according to claim 1, wherein said step of ion-implanting the second conductivity type impurity is effected after said the step of ion-implanting the first conductivity type impurity.

4. A method for manufacturing semiconductor devices according to claim 1, wherein an acceleration voltage used in said step of ion-implanting the first conductivity type impurity is set to be higher than that used in said step of ion-implanting the second conductivity type impurity.

5. A method for manufacturing semiconductor devices according to claim 1, wherein said insulating layer includes a silicon oxide film and a silicon nitride film which are laminated.

6. A method for manufacturing semiconductor devices according to claim 1, wherein said insulating layer includes a silicon oxide film, a silicon nitride film and a resist layer which are laminated.

7. A method for manufacturing semiconductor devices according to claim 1, wherein said second conductivity type impurity is phosphorus.

8. A method for manufacturing semiconductor devices according to claim 1, wherein said first conductivity type impurity is boron.

9. A method for manufacturing semiconductor devices according to claim 6, wherein said silicon oxide film has a thickness of 3 to 4 $\mu$m, said silicon nitride film has a thickness of 3000 to 5000 Å, and said resist layer has a thickness of 3 to 8 $\mu$m.

10. A method for manufacturing semiconductor devices according to claim 9, wherein said step of ion-implanting the second conductivity type impurity is effected to ion-implant phosphorus by use of an acceleration voltage of 1.5 to 2.5 MeV.

11. A method for manufacturing semiconductor devices according to claim 10, wherein said step of ion-implanting the first conductivity type impurity is effected to ion-implant boron by use of an acceleration voltage of 100 to 120 KeV.

12. A method for manufacturing twin well type semiconductor devices having a P-type well and an N-type well comprising the steps of:
   forming an insulating layer of a laminated structure including a nitride film on a P-type semiconductor substrate;
   selectively removing part of said insulating layer to expose a predetermined portion of a surface of said semiconductor substrate;
   ion-implanting phosphorus by applying an acceleration voltage of 1.5 to 2.5 MeV, using said insulating layer as a mask, to introduce phosphorus into said substrate surface under said insulating layer, thereby forming a first phosphorus region, and into a deeper portion of the predetermined portion, thereby forming a second phosphorus region having an impurity concentration higher than that of the first phosphorus region;
   ion-implanting boron by applying an acceleration voltage of 100 to 120 KeV, using said insulating layer as a mask, to introduce boron into said substrate surface in said predetermined portion, thereby forming a boron region;
   removing said insulating layer; and
   diffusing the introduced phosphorus and boron by heat treatment to form an N-type first well region in the substrate under a portion where said insulating layer had been formed, a P-type second well region in the predetermined portion of the substrate surface, and an N-type embedded region in a deeper portion of the predetermined portion, said embedded region having an impurity concentration higher than that of said first well region.

13. A method for manufacturing twin well type semiconductor devices having a plurality of P-type well regions arranged on the surface of a P-type semiconductor substrate, a plurality of N-type well regions each of which is arranged between said P-type well regions in the semiconductor substrate, and an N-type embedded region with a high impurity concentration formed under said P-type well regions in the P-type semiconductor substrate, comprising the steps of:
   forming an insulating layer of a laminated structure including a nitride film on a P-type semiconductor substrate;
   selectively removing part of said insulating layer to expose a portion of the surface of said semiconductor substrate where a P-type well region is to be formed;
   ion-implanting phosphorus by applying an acceleration voltage of 1.5 to 2.5 MeV, using said insulating layer as a mask, to introduce phosphorus into said substrate surface under said insulating layer, thereby forming a first phosphorus region, and into a lower portion of the predetermined portion, thereby forming a second phosphorus region having an impurity concentration higher than that of said first phosphorus region;
   ion-implanting boron by applying an acceleration voltage of 100 to 120 KeV, using said insulating layer as a mask, to introduce boron into the portion of the substrate where the P-type well region is to be formed, thereby forming a boron region;
   removing said insulating layer; and
   effecting heat treatment to diffuse the introduced phosphorus and boron.

* * * * *